(12) United States Patent
Shih

(10) Patent No.: US 8,223,489 B2
(45) Date of Patent: Jul. 17, 2012

(54) ELECTRONIC DEVICE

(75) Inventor: Chin-Chung Shih, Taoyuan (TW)

(73) Assignee: HTC Corporation, Taoyuan, Taoyuan County (TW)

( * ) Notice: Subject to any disclaimer, the term of this patent is extended or adjusted under 35 U.S.C. 154(b) by 347 days.

(21) Appl. No.: 12/206,037

(22) Filed: Sep. 8, 2008

(65) Prior Publication Data
US 2009/0103261 A1    Apr. 23, 2009

(30) Foreign Application Priority Data

Oct. 23, 2007    (TW) ................................ 96139740 A

(51) Int. Cl.
*G06F 1/16* (2006.01)
*H05K 5/00* (2006.01)
*H05K 7/00* (2006.01)

(52) U.S. Cl. ............................... 361/679.58; 361/679.55

(58) Field of Classification Search ............ 361/679.17, 361/679.27, 679.55, 679.58
See application file for complete search history.

(56) References Cited

U.S. PATENT DOCUMENTS

| | | | |
|---|---|---|---|
| 6,366,440 B1 * | 4/2002 | Kung | 361/147 |
| 7,283,355 B2 * | 10/2007 | Han | 361/679.55 |
| 7,426,115 B2 * | 9/2008 | Shih et al. | 361/756 |
| 7,539,011 B2 * | 5/2009 | Shih et al. | 361/679.26 |
| 7,583,500 B2 * | 9/2009 | Ligtenberg et al. | 361/147 |
| 2001/0048587 A1 * | 12/2001 | Yim | 361/681 |
| 2005/0018393 A1 * | 1/2005 | Kuo et al. | 361/683 |
| 2005/0036284 A1 * | 2/2005 | Kang | 361/683 |
| 2005/0078444 A1 * | 4/2005 | Hong | 361/683 |
| 2005/0083644 A1 * | 4/2005 | Song | 361/683 |
| 2005/0128695 A1 * | 6/2005 | Han | 361/683 |
| 2005/0167992 A1 * | 8/2005 | Lo et al. | 292/251.5 |
| 2006/0006674 A1 * | 1/2006 | Kang et al. | 292/251.5 |
| 2006/0046792 A1 * | 3/2006 | Hassemer et al. | 455/575.1 |
| 2006/0056140 A1 * | 3/2006 | Lev | 361/683 |
| 2007/0018956 A1 * | 1/2007 | Kim et al. | 345/156 |
| 2007/0133156 A1 * | 6/2007 | Ligtenberg et al. | 361/681 |
| 2008/0024964 A1 * | 1/2008 | Lev et al. | 361/681 |
| 2008/0055837 A1 * | 3/2008 | Chueh et al. | 361/683 |

FOREIGN PATENT DOCUMENTS

TW    M301504    11/2006

OTHER PUBLICATIONS

English language translation of abstract of TW M301504 (published Nov. 21, 2006).

* cited by examiner

*Primary Examiner* — Adrian S Wilson
(74) *Attorney, Agent, or Firm* — Thomas|Kayden

(57) ABSTRACT

An electronic device includes a first main body and a second main body. The first main body includes a first housing, a first magnetic member and a first elastic member. The second main body includes a second housing and a second magnetic member. The second housing is pivotally connected with the first housing. The first elastic member is disposed within the first housing. The first elastic member connecting with the first magnetic member and the first housing makes the first magnetic member floatable within the first housing. The second magnetic member is disposed within the second housing. When the second housing moves close to a surface of the first housing, the magnetic force between the first and second magnetic members is increased, so as to hold the relative position of the first and second main bodies.

15 Claims, 11 Drawing Sheets

ELECTRONIC DEVICE

This application claims the benefit of Taiwan application Serial No. 96139740, filed Oct. 23, 2007, the subject matter of which is incorporated herein by reference.

BACKGROUND OF THE INVENTION

1. Field of the Invention

The invention relates in general to an electronic device, and more particularly to an electronic device having a weak magnetic force on the surface of its housing.

2. Description of the Related Art

In this era of technology, electronic devices such as portable electronic devices have played an important role in people's lives. For example, laptop computers and mobile phones are compact in size so that users can take notes, process files, surf the internet or check emails anywhere and anytime. As a result, portable electronic devices are very popular in the market now.

Portable electronic device nowadays usually includes a first main body and a second main body. The first main body includes a first housing and an input device, such as a keyboard. The second main body includes a second housing and a display device, such as a screen. When the electronic device is not in use, the second main body covers the first main body for protecting the keyboard of the first main body and the screen of the second main body. At present, the second main body is mostly connected to the first main body with a rotating hinge design or a sliding hinge design.

Because the rotating hinge design or the sliding hinge design has many members, the structure of the electronic device becomes more complicated, hence increasing the manufacturing cost.

SUMMARY OF THE INVENTION

The invention is directed to an electronic device. The relative position between a first main body and a second main body of the electronic device is held by a magnetic force.

According to the present invention, an electronic device including a first main body and a second main body is provided. The first main body includes a first housing, a first magnetic member and a first elastic member. The second main body includes a second housing and a second magnetic member. The second main body is pivotally connected with the first main body. The first elastic member is disposed within the first housing. The first elastic member connecting with the first magnetic member and the first housing makes the first magnetic member be floatable within the first housing. The second housing is pivotally connected with the first housing. The second magnetic member is disposed within the second housing. When the second housing moves close to a surface of the first housing, the second magnetic member and the first magnetic member attract each other so that the first magnetic member moves toward the surface. Thus, the magnetic force between the first magnetic member and the second magnetic member is further increased, so as to hold the relative position of the first and second main bodies.

According to the present invention, an electronic device including a first main body and a second main body is provided. The first main body includes a first housing, a firs magnetic member and a first elastic member. The second main body includes a second housing and a second magnetic member. The second main body is detachably disposed on the first main body. The first elastic member is disposed within the first housing. The first elastic member connecting with the first magnetic member and the first housing makes the first magnetic member floatable within the first housing. When a base surface of the second housing moves close to a surface of the first housing, the second magnetic member and the first magnetic member attract each other so that the first magnetic member moves toward the surface, and thus the magnetic force between the first magnetic member and the second magnetic member is increased so as to hold the relative position of the first and second main bodies.

The invention will become apparent from the following detailed description of the preferred but non-limiting embodiments. The following description is made with reference to the accompanying drawings.

DETAILED DESCRIPTION OF THE INVENTION

First Embodiment

Figure 1:
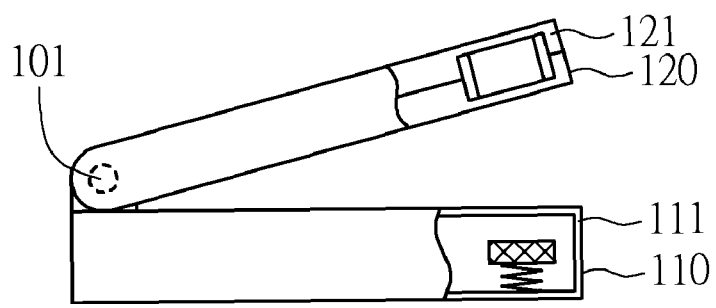
FIG. 1 is a diagram showing an electronic device according to a first embodiment of the present invention in a non-closed position.
Figure 2:
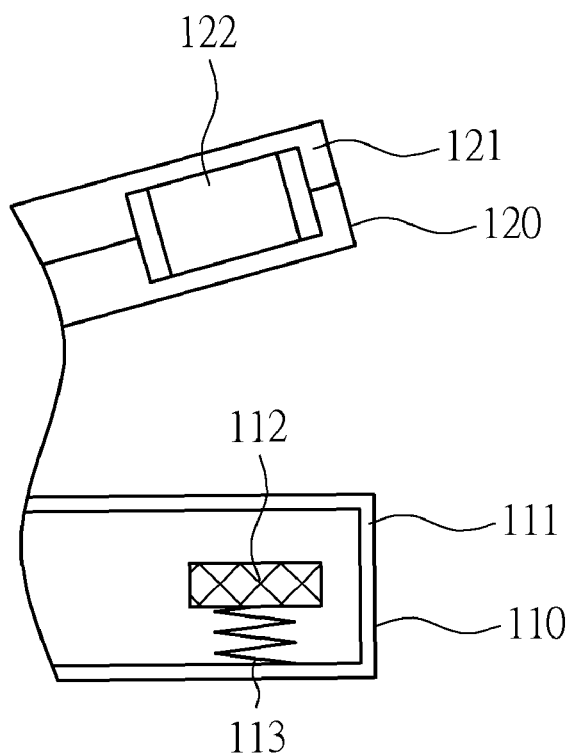
FIG. 2 shows a partially enlarged view of the electronic device in FIG. 1 in the non-closed position.

FIG. 1 is a diagram showing an electronic device 100 according to a first embodiment of the present invention in a non-closed position. FIG. 2 shows a partially enlarged view of the electronic device 100 in FIG. 1 in the non-closed position. The electronic device 100 is, for example, a smart phone, a PDA phone, a laptop computer, an ultra mobile PC (UMPC) or a portable electronic device. As shown in FIG. 1, the electronic device 100 includes a first main body 110 and a second main body 120. The first main body 110 includes a first housing 111, and the second main body 120 includes a second housing 121. The second housing 121 is pivotally connected with the first housing 111. In the present embodiment, the second housing 121 is pivotally connected with the first housing 111 through a pivot 101 so that the second housing 121 is able to rotate relative to the first housing 111. As shown in FIG. 2, the first main body 110 further includes a first magnetic member 112 and a first elastic member 113. The second main body 120 further includes a second magnetic member 122. The first magnetic member 112 is, for example, a magnet. The second magnetic member 122 is disposed within the second housing 121. Preferably, the second magnetic member 122 is made of a magnetic material or is, for example, a magnet for generating an attractive magnetic force with the first magnetic member 112. The magnetic material is, for example, a diamagnetic material, a paramagnetic material or ferromagnetic material.

The first elastic member 113 is disposed within the first housing 111 and connects with the first magnetic member 112 and the first housing 111 so that the first magnetic member 112 is floatable within the first housing 111. The first elastic member 113 is, for example, a spiral spring in the present embodiment for providing an elastic force for the first magnetic member 112.

Figure 3:
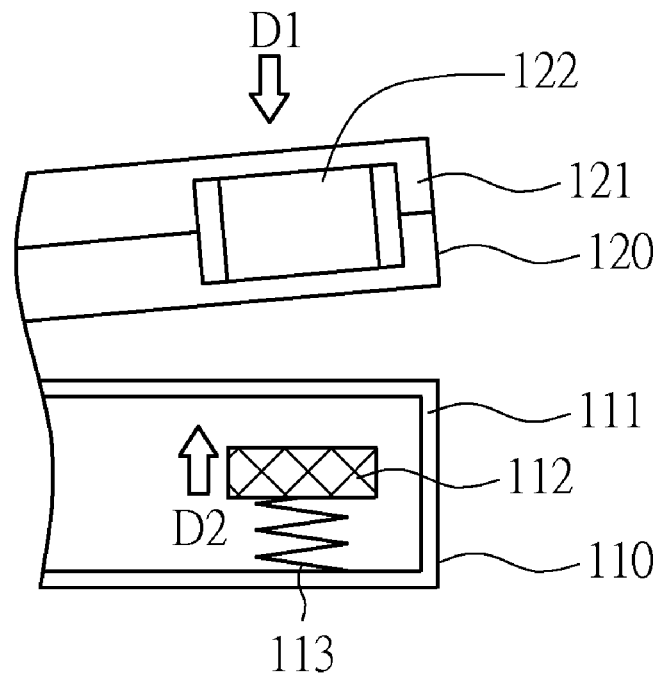
FIG. 3 shows a partially enlarged view of the second housing in FIG. 1 moving close to the first housing.
Figure 4:
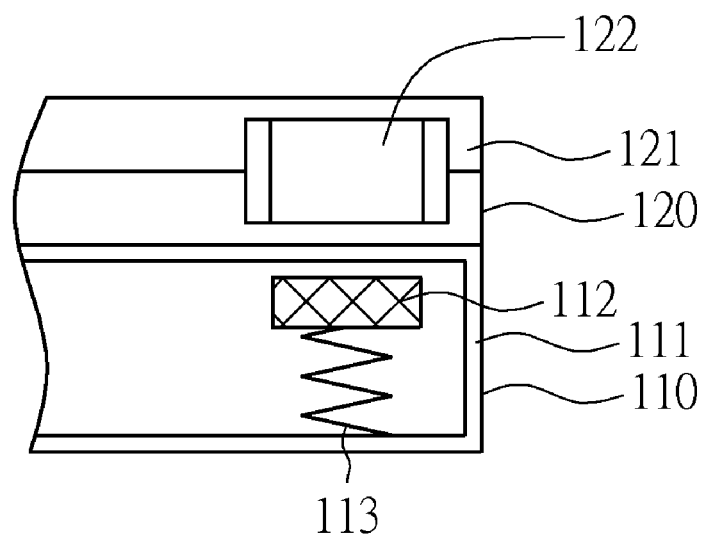
FIG. 4 is a diagram showing the second main body in FIG. 1 covering the first main body.

FIG. 3 shows a partially enlarged view of the second housing 121 in FIG. 1 moving close to the first housing 111. FIG. 4 is a diagram showing the second main body 120 in FIG. 1 covering the first main body 110. As shown in FIG. 3, when the second housing 121 moves close to a surface of the first housing 111 along a direction D1, the first magnetic member 112 and the second magnetic member 122 attract each other so that the first magnetic member 112 moves toward the surface along the direction D2 to decrease the distance between the first magnetic member 112 and the second magnetic member 122, thus the magnetic force between the first magnetic member 112 and the second magnetic member 122 is increased. Meanwhile, the first elastic member 113 also provides an elastic force for the first magnetic member 112. The second housing 121 keeps moving toward the surface of the first housing 111 along the direction D1 until the second main body 120 covers the first main body 110, as shown in FIG. 4. At this moment, the distance between the first magnetic member 112 and the second magnetic member 122 is the shortest, and the magnetic force is the greatest. Therefore, the relative position between the first main body 110 and the second main body 120 is held, and the second main body 120 covers the first main body 110 firmly.

When the second housing 121 moves away from the surface of the first housing 111, the distance between the first magnetic member 112 and the second magnetic member 122 increases, which decreases the magnetic force between the second magnetic member 122 and the first magnetic member 112. As a result, the elastic force makes the first magnetic member 112 move away from the surface of the first housing 111 and back to the original position (shown in FIG. 2).

Figure 5A:
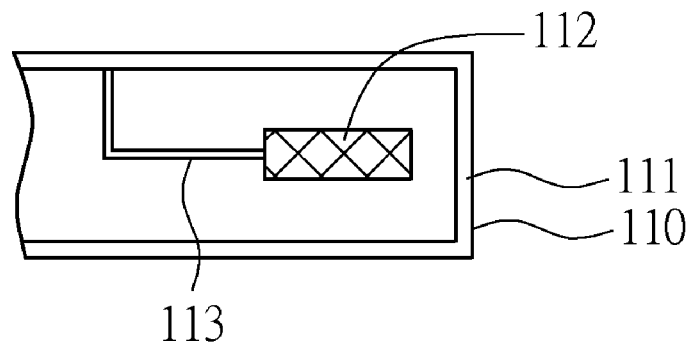
FIG. 5A shows the first elastic member in the first embodiment is a leaf spring.
Figure 5B:
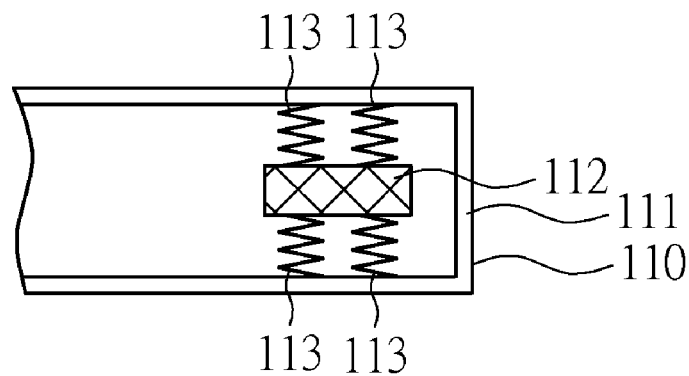
FIG. 5B shows several first elastic members are used and are spiral springs in the first embodiment.

Although the first elastic member 113 is a spiral spring in the present embodiment as an example, the invention is not limited thereto. Referring to FIG. 5A and FIG. 5B, FIG. 5A shows the first elastic member 113 is a leaf spring. FIG. 5B shows several first elastic members 113 are used and are spiral springs in the first embodiment.

In FIG. 5A, one end of the leaf spring is connected with a side of the first magnetic member 112, and the other end is connected with the first housing 111. In FIG. 5B, several first elastic members 113 connect the first housing 111 with an upper surface and a lower surface of the first magnetic member 112. Therefore, the first magnetic member 112 is floatable via the first elastic members 113. The more the first elastic members 113 are used, the greater effect of the damping is. And better buffering capacity is provided accordingly. Therefore, when the first magnetic member 112 moves back to the original position, no serious vibration occurs.

Figure 6:
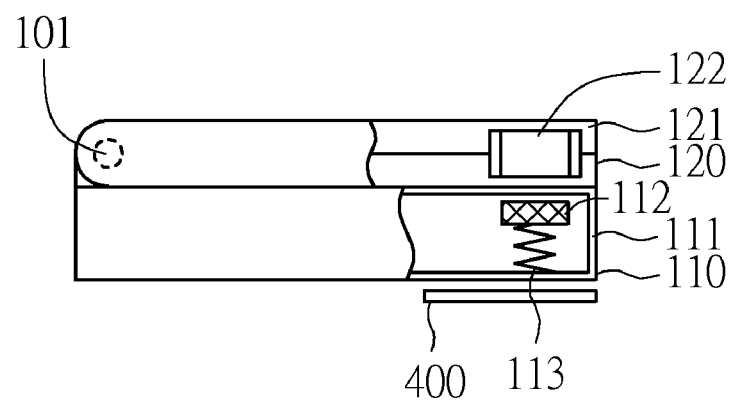
FIG. 6 shows the electronic device of the first embodiment is in a closed position and adjacent to an object.

FIG. 6 shows the electronic device 100 of the first embodiment is in a closed position and adjacent to an object. When the second main body 120 covers the first main body 110, the distance between the first magnetic member 112 and the lower surface of the first housing 111 is longer, so that the magnetic force on the lower surface of the first housing 111 is weaker. When an object such as a credit card that is easily affected by the magnetic field is placed near the lower surface of the first housing 111, the electronic device 100 does not demagnetize the credit card 400 easily. Moreover, for a user who has a pacemaker in his or her body, the pacemaker has a little chance to be interfered as long as the magnetic force is not strong enough.

Figure 7:
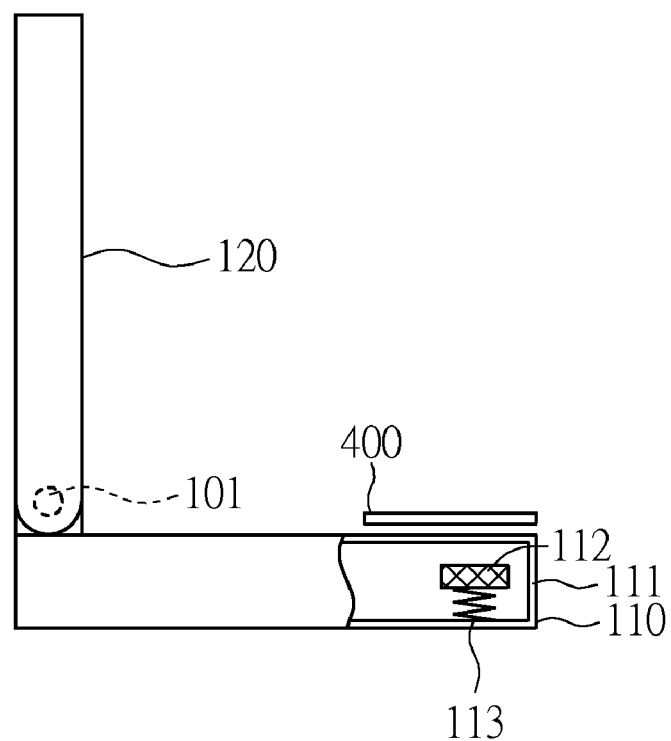
FIG. 7 shows the electronic device of the first embodiment is in the non-closed position and adjacent to an object.

FIG. 7 shows the electronic device 100 of the first embodiment is in the non-closed position and adjacent to an object. When the second main body 120 does not cover the first main body 110, the first magnetic member 112 is back to the original position. The first magnetic member 112 is disposed apart from the upper surface and the lower surface of the first housing 111 by a predetermined distance. The first magnetic member 112 at the predetermined distance has a weak magnetic force to the surface of the housing, so that the credit card 400 is not demagnetized.

It should be noted that the location of the first magnetic member 112 is possibly to be exchanged with that of the second magnetic member 122. When the electronic device 100 is a laptop computer, the first main body 110 is, for example, a keyboard. The first magnetic member 112 and the first elastic member 113 are disposed in the first main body 110. However, the first magnetic member 112 and the first elastic member 113 can be disposed in the second main body 120, that is, for example, a display device.

Second Embodiment

Figure 8:
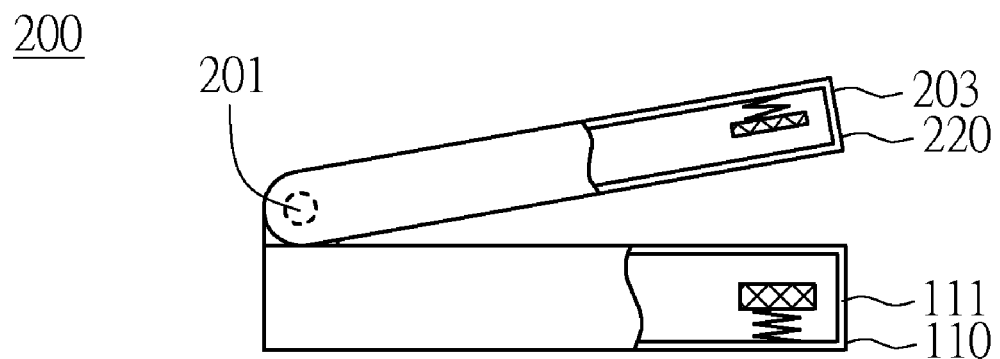
FIG. 8 is a diagram showing the electronic device according to a second embodiment of the present invention in a non-closed position.
Figure 9:
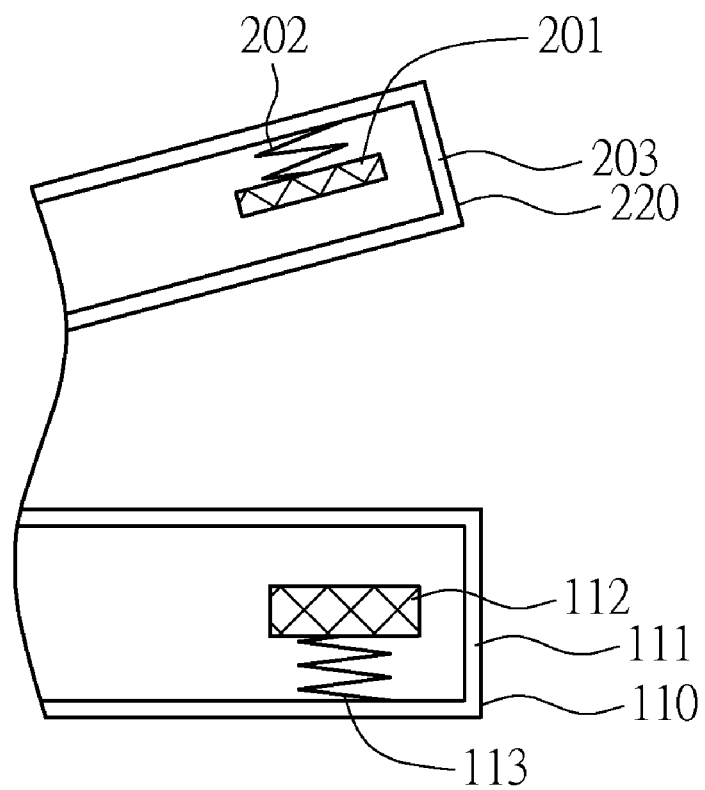
FIG. 9 shows a partially enlarged view of the electronic device in FIG. 8 in the non-closed position.

FIG. 8 is a diagram showing the electronic device 200 according to a second embodiment of the present invention in a non-closed position. FIG. 9 shows a partially enlarged view of the electronic device 200 in FIG. 8 in the non-closed position. The difference between the present embodiment and the first embodiment is that the second main body 220 further includes a second elastic member 202. As shown in FIG. 8, the electronic device 200 includes a first main body 110 and a second main body 220. The second main body 220 can cover the first main body 110. The first main body 110 includes a first housing 111, and the second main body 220 includes a second housing 203. The second housing 203 is pivotally connected with the first housing 111. The second housing 203 is connected with the first housing 111 through the pivot 201, so that the second housing 203 is able to rotate relative to the first housing 111. In FIG. 9, preferably the first main body 110 further includes a first magnetic member 112 and a first elastic member 113. The second main body 220 includes a second magnetic member 201 and a second elastic member 202. Both the first magnetic member 112 and the second magnetic member 201 are, for example, magnets for attracting each other to generate a magnetic force. It should be noted that even if only one of the first and second magnetic members 112 and 201 is magnet or is made of a magnetic material, the function between the first and second magnetic members 112 and 201 is still workable in the embodiment.

The first elastic member 113 is disposed within the first housing 111 and connects with the first magnetic member 112 and the first housing 111, so that the first magnetic member 112 is floatable within the first housing 111. The first elastic member 113 is, for example, a spiral spring for providing the first magnetic member 112 with an elastic force. The second elastic member 202 is disposed within the second housing 203 and connects with the second magnetic member 201 and the second housing 203, so that the second magnetic member 201 is floatable within the second housing 203. The second elastic member 202 is, for example, also a spiral spring for providing the second magnetic member 201 with an elastic force.

Figure 10:
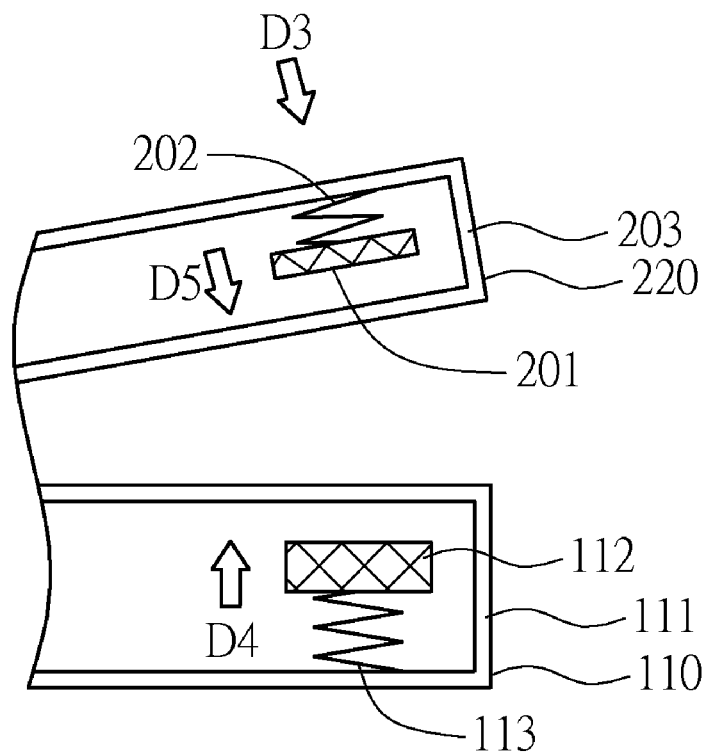
FIG. 10 shows a partially enlarged view of the second housing moving close to the first housing in the second embodiment.
Figure 11:
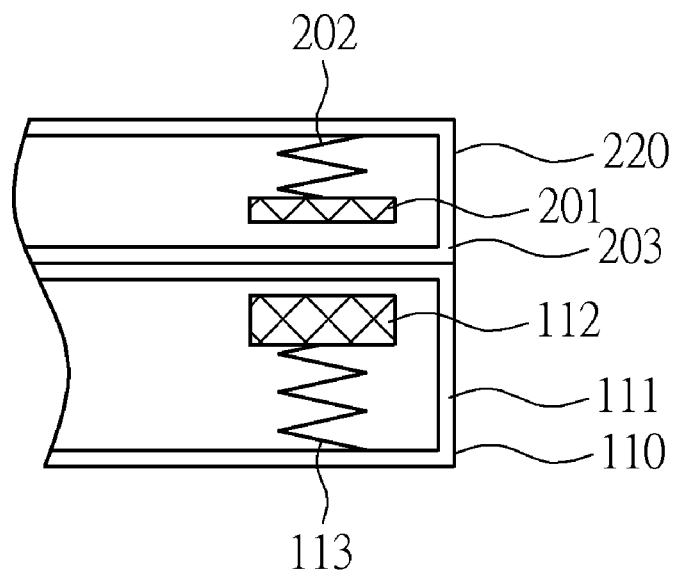
FIG. 11 shows a partially enlarged view of the second main body covering the first main body in the second embodiment.

FIG. 10 shows a partially enlarged view of the second housing 203 moving close to the first housing 111 in the second embodiment. FIG. 11 shows a partially enlarged view of the second main body 220 covering the first main body 110 in the second embodiment. In FIG. 10, the second housing 203 moves toward the surface of the first housing 111 along a direction D3, and the first magnetic member 112 and the second magnetic member 201 attract each other so that the first magnetic member 112 moves toward the second main body 220 along a direction D4, and the second magnetic member 201 moves toward the first main body 110 along the surface along a direction D5. The distance between the first magnetic member 112 and the second magnetic member 201 decreases, so that the magnetic force is increased accordingly. Meanwhile, the first elastic member 113 provides an elastic force for the first magnetic member 112, and the second elastic member 202 provides an elastic force for the second magnetic member 201. The second housing 203 keeps moving toward the surface of the first housing 111 along the direction D3 until the second main body 220 covers the first main body 110, as shown in FIG. 11. At this moment, the distance between the first magnetic member 112 and the second magnetic member 201 is shortest, and the magnetic force is the greatest. Therefore, the relative position of the first main body 110 and the second main body 220 is held, and the second main body 220 covers the first main body 110 firmly.

When the second housing 203 moves away from the surface of the first housing 111, the distance between the first magnetic member 112 and the second magnetic member 201 increases, so that the magnetic force between the first magnetic member 112 and the second magnetic member 201 is decreased. Therefore, the elastic forces from the first elastic members 113 and second elastic members 202 make the first magnetic member 112 and the second magnetic member 201 move away from the surfaces of the housings and back to the original positions (shown in FIG. 9).

Figure 12A:
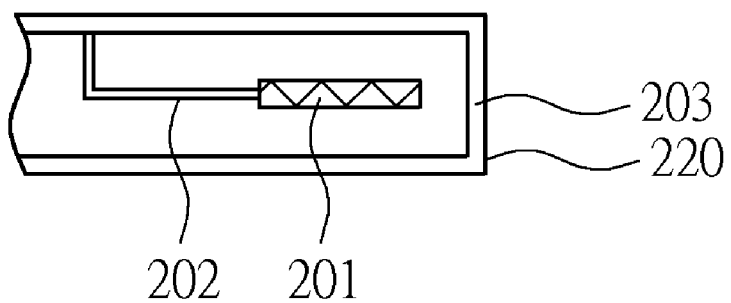
FIG. 12A shows the second elastic member of the second embodiment is a leaf spring.
Figure 12B:
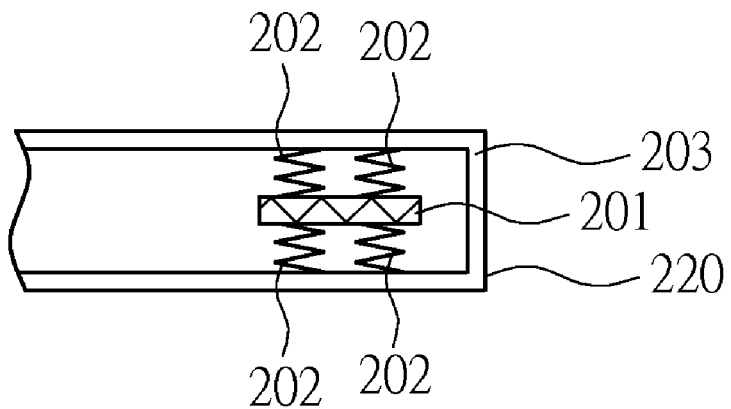
FIG. 12B shows several second elastic members are used and are spiral springs in the second embodiment.

FIG. 12A shows the second elastic member 202 of the second embodiment is a leaf spring. FIG. 12B shows several second elastic members are used and are spiral springs in the second embodiment.

In FIG. 12A, one end of the leaf spring is connected with a side of the second magnetic member 201, and the other end of the leaf spring is connected with the second housing 203. In FIG. 12B, several second elastic members 202 connect the second housing 203 with an upper surface and a lower surface of the second magnetic member 201. The increase of the second elastic members 202 generates higher damping effect to provide better buffering capacity. Therefore, when the second magnetic member 201 is back to the original position, no serious vibration occurs.

Figure 13:
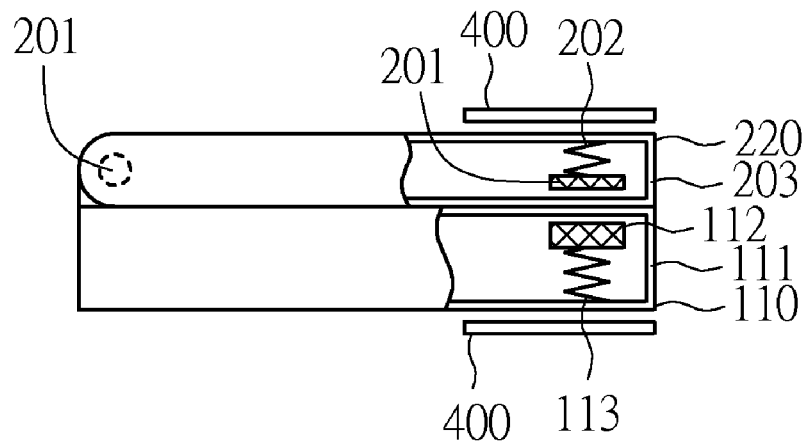
FIG. 13 shows the electronic device of the second embodiment is in the closed position and adjacent to an object.

FIG. 13 shows the electronic device 200 of the second embodiment is in the closed position and adjacent to an object. When the second main body 220 covers the first main body 110, the distance between the first magnetic member 112 and the lower surface of the first housing 111 is the longest. Also, the distance between the second magnetic member 201 and the upper surface of the second housing 203 is the longest. As a result, the magnetic forces on the lower surface of the first housing 111 and on the upper surface of the second housing 203 are weaker. When an object such as a credit card 400 that is easily affected by a magnetic field is placed near the first housing 111 or the second housing 203, the negative effect upon the object is reduced. In addition, for a user who has a pacemaker, the pacemaker has a lower change to be interfered by the magnetic force.

Figure 14:
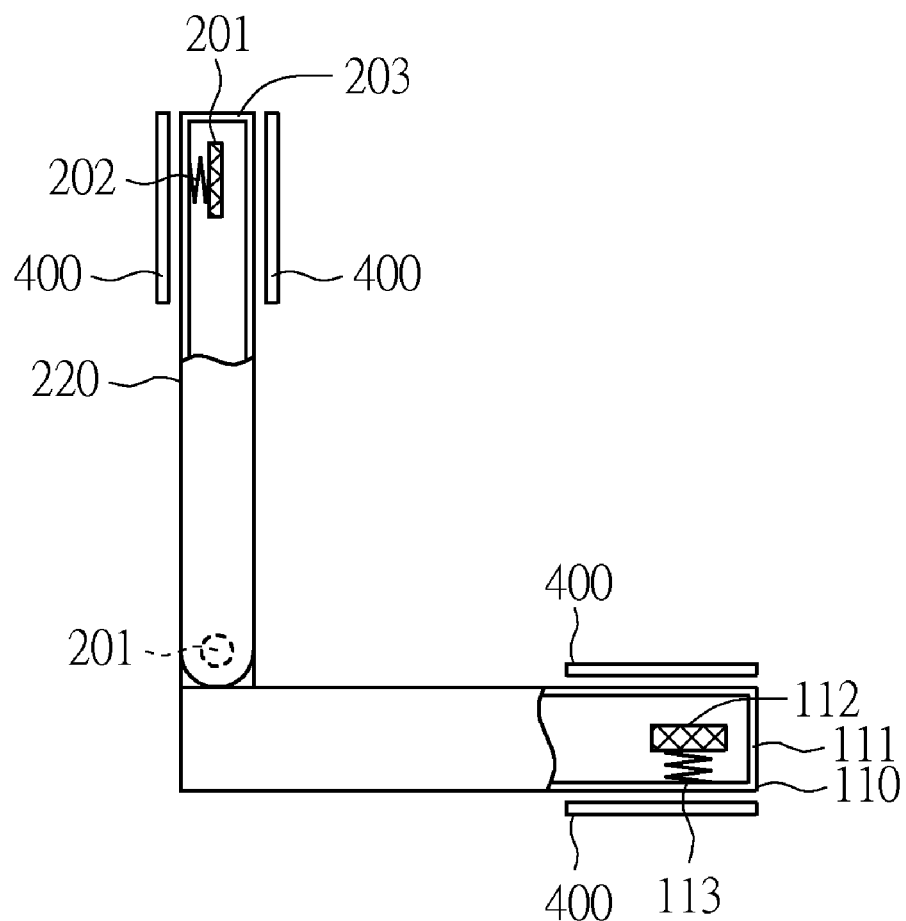
FIG. 14 shows the electronic device of the second embodiment is in the non-closed position and adjacent to an object.

FIG. 14 shows the electronic device 200 of the second embodiment is in the non-closed position and adjacent to an object. When the second main body 220 does not cover the first main body 110, the first magnetic member 112 and the second magnetic member 201 are back to the original position. The first magnetic member 112 is not close to the upper surface and the lower surface of the first housing 111. Also, the second magnetic member 201 is disposed apart from the upper surface and the lower surface of the second housing 203. Therefore, the credit card 400 in any position of the electronic device 200 is not affected easily.

Third Embodiment

Figure 15:
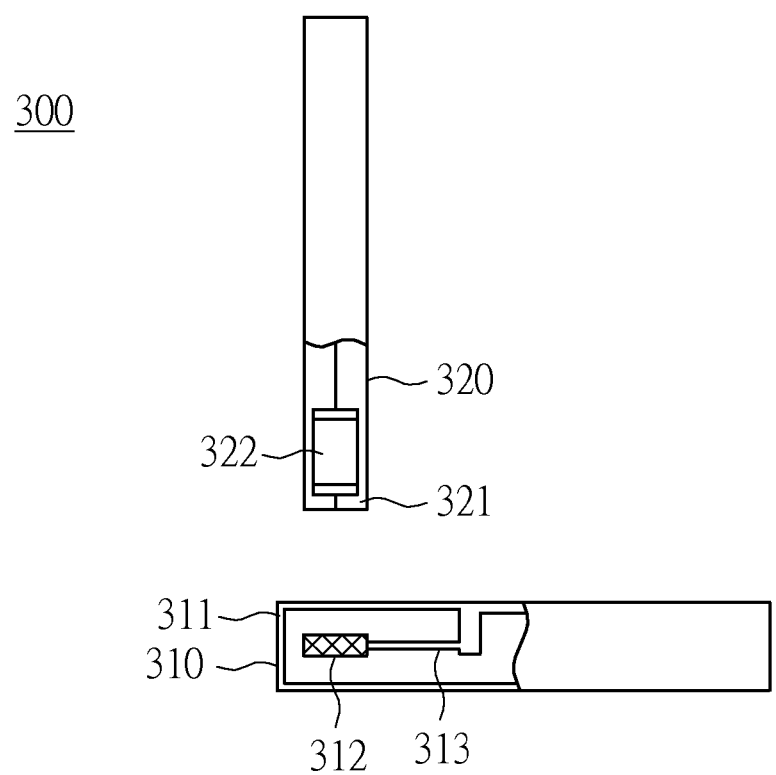
FIG. 15 is a diagram showing an electronic device according to a third embodiment of the present invention having a first main body separated from a second main body.

FIG. 15 is a diagram showing an electronic device 300 according to a third embodiment of the present invention having a first main body 310 separated from a second main body 320. The difference between the present embodiment and the first embodiment is that the second main body 320 can be detached from the first main body 310. The first main body 310 includes a first housing 311, a first magnetic member 312 and a first elastic member 313. The first elastic member 313 is disposed within the first housing 311 and connects with the first magnetic member 312 and the first housing 311, so that the first magnetic member 312 is floatable within the first housing 311. The second main body 320 includes a second housing 321 and a second magnetic member 322. The second magnetic member 322 is disposed within the second housing 321. The first magnetic member 312 is, for example a magnet. Preferably, the second magnetic member 322 is made of a magnetic material or is a magnet, for generating a magnetic force between the first magnetic member 312 and the second magnetic member 322. The first elastic member 313 is, for example, a leaf spring for providing an elastic force for the first magnetic member 312.

The first main body 310 is, for example, an input device such as an external keyboard, and the second main body 320 is, for example, a display device. When a portable electronic device is equipped only with a display device but has no keyboard, it is inconvenient for a user to key in a lot of words.

Therefore, the second main body 320 works with the first main body 310 (such as a keyboard) to make it easier to key in words.

Figure 16:
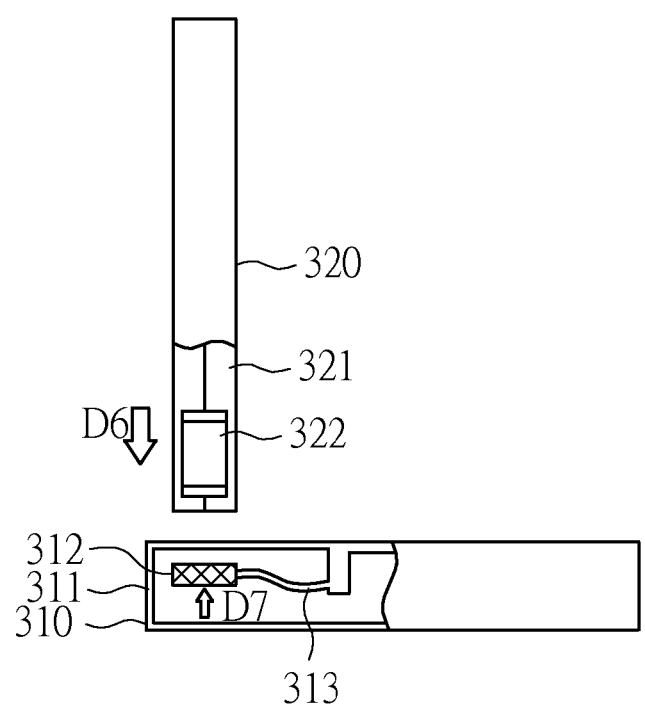
FIG. 16 shows the second housing in FIG. 15 moving close to the first housing.
Figure 17:
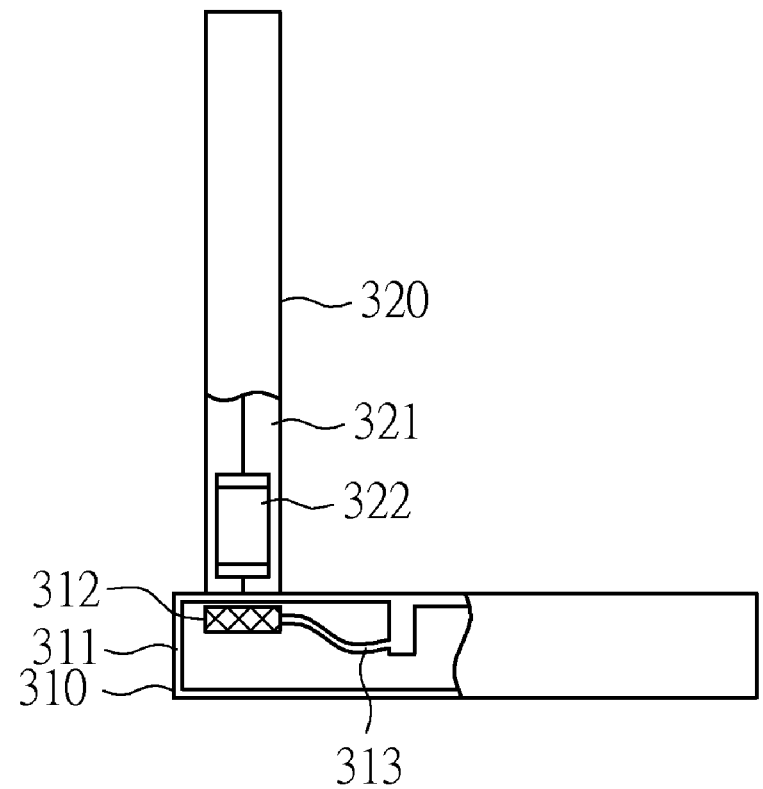
FIG. 17 shows the second main body in FIG. 15 disposed on the first main body.

FIG. 16 shows the second housing 321 in FIG. 15 moving close to the first housing 311. FIG. 17 shows the second main body 320 in FIG. 15 disposed on the first main body 310. In FIG. 16, when the second housing 321 with its base surface moves close to a surface of the first housing 311 along a direction D6, the first magnetic member 312 and the second magnetic member 322 attract each other to make the first magnetic member 312 move toward the surface along a direction D7. The distance between the first magnetic member 312 and the second magnetic member 322 is then reduced, and the magnetic force is thus increased. Meanwhile, the first elastic member 313 provides the first magnetic member 312 with an elastic force. The base surface of the second housing 321 keeps moving toward the surface of the first housing 311 along the direction D6 until the second main body 320 is connected with the first main body 310, as shown in FIG. 17. At this moment, the distance between the first magnetic member 312 and the second magnetic member 322 is the shortest, and the magnetic force is the greatest so as hold the relative position of the second main body 320 and the first main body 310, not only prevent the first main body 310 from moving relative to the second main body 320 but also firmly fixing the second main body 320 on the first main body 310.

When the base surface of the second housing 321 moves away from the surface of the first housing 311, the distance between the first magnetic member 312 and the second magnetic member 322 increases, and the magnetic force between the second magnetic member 322 and the first magnetic member 312 is decreased. Therefore, the elastic force makes the first magnetic member 312 move away from the surface of the first housing 311 and back to the original position (shown in FIG. 15).

Figure 18A:
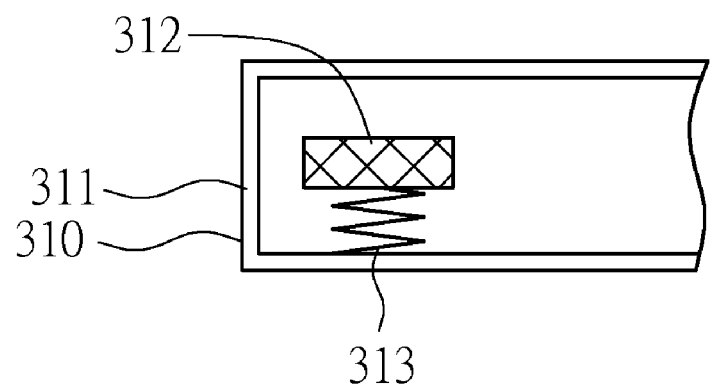
FIG. 18A shows the first elastic member is a spiral spring in the third embodiment.
Figure 18B:
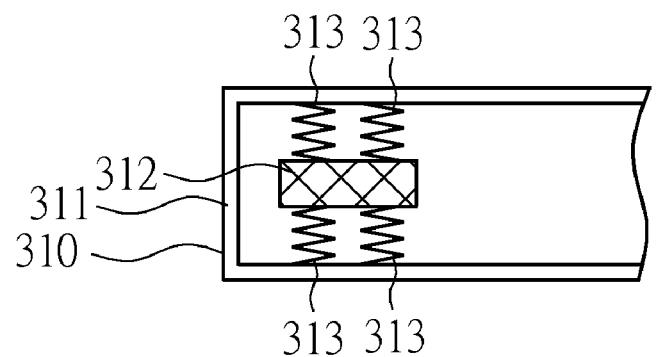
FIG. 18B shows several first elastic members are used and are spiral springs in the third embodiment.

Although in the present embodiment, the first elastic member 313 is a leaf spring as an example, the invention is not limited thereto. FIG. 18A shows the first elastic member 313 is a spiral spring in the third embodiment. FIG. 18B shows several first elastic members 312 are used and are spiral springs in the third embodiment.

In FIG. 18A, the spiral spring connects with the first housing 311 and the first magnetic member 312. In FIG. 18B, the first elastic members 313 connect the first housing 311 with an upper surface and a lower surface of the first magnetic member 312. The increase of the first elastic members 313 enhances the damping effect to provide better buffering capacity.

Figure 19:
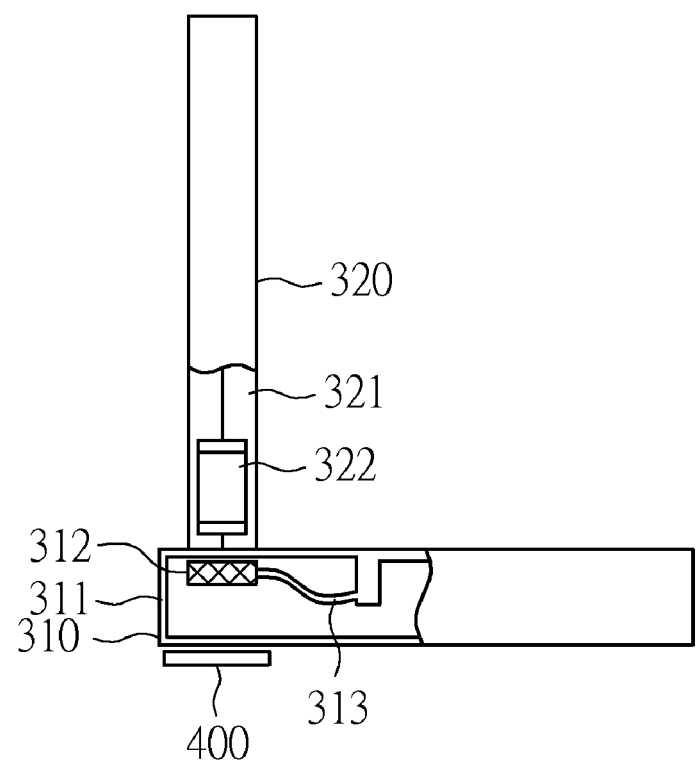
FIG. 19 shows the second main body attached to the first main body and adjacent to an object in the third embodiment.

FIG. 19 shows the second main body 320 attached to the first main body 310 and adjacent to an object in the third embodiment. When the second main body 320 is attached to the first main body 310, the distance between the first magnetic member 312 and the lower surface of the first housing 311 increases, so that the magnetic field on the lower surface of the first housing 311 is decreased. Thus, when an object such as a credit card 400 that is easily affected by the magnetic force is placed near the first housing 311, the chance of the magnetic force to affect the object is reduced. Moreover, for a user having a pacemaker, the chance that the pacemaker is interfered by the magnetic force is lowered.

When the second main body 320 moves away from the first main body 310, the first magnetic member 312 is back to the original position, so that the magnetic forces on the surfaces of the first and second main bodies are weaker. Therefore, the magnetic forces do not affect an object such as a credit card 400.

The locations of the first magnetic member 312 and the second magnetic member 322 of the third embodiment can be exchanged. When the second main body 320 is, for example, a smart phone, a PDA phone or an ultra mobile PC, the first main body 310 can be a keyboard. The first magnetic member 312 and the first elastic member 313 are disposed within the first main body 310 in the embodiment. However, the first magnetic member 312 and the first elastic member 313 can be disposed in the second main body 320.

When a user operates a portable electronic device such as a mobile phone or a laptop computer, most of the time he or she operates the electronic device within a short distance. And, many users like to put mobile phones in their purses along with magnetic cards, such as credit cards. Therefore, credit cards are affected easily. If a user who has a pacemaker puts the mobile phone inside a pocket near his or her chest, a strong magnetic force would interfere with the pacemaker, so that the pacemaker would fail to control heartbeat, endangering the life of the user. In the above embodiments, the second main body is attached to or covers the first main body firmly. In addition, no matter the electronic device is in the closed position or the non-closed position, the magnetic force on the surface of the housing is so weak that causes no harm to any adjacent object.

The electronic device according to the above embodiments has many advantages partially described in the following.

When the first magnetic member or the second magnetic member is a magnet, it does not have to be disposed very close to the surface of the housing, which decreases the magnetic force on the surface of the housing. Therefore, as an object such as a credit card that is easily affected by the magnetic force is placed near the surface of the housing, the object is not easily affected by the magnetic force.

Although the first magnetic member or the second magnetic member is not disposed very close to the surface of the housing, since the first or the second magnetic member is floatable, the first or the second magnetic member is still capable of holding the relative position of the second main body and the first main body.

Moreover, the magnetic force on the surface of the housing is so weak that the pacemaker in a user's body has a little chance to be interfered.

In addition, the first elastic member, the second elastic member, the first magnetic member and the second magnetic member are all disposed inside the first housing or the second housing. Therefore, the appearance of the electronic device is more appealing.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electronic device comprising:
   a first main body having:
      a first housing;
      a first magnetic member; and
      a first elastic member disposed within the first housing, wherein the first elastic member connects with the first magnetic member and the first housing, so that the first magnetic member is floatable completely within the first housing; and
   a second main body pivotally connected with the first main body and having:

a second housing pivotally connected with the first housing;

a second magnetic member; and a second elastic member disposed within the second housing, wherein the second elastic member connects with the second magnetic member and the second housing, so that the second magnetic member is floatable completely within the second housing;

wherein when the second housing moves close to a surface of the first housing, the second magnetic member and the first magnetic member attract each other so that the first magnetic member vertically moves toward the surface within the first housing, and thus the magnetic force between the first magnetic member and the second magnetic member is increased and the magnetic forces on an external surface of the second housing and on an external surface of the first housing are decreased.

2. The device according to claim 1, wherein the first magnetic member is a magnet.

3. The device according to claim 1, wherein the second magnetic member is a magnet or is made of a magnetic material.

4. The device according to claim 1, wherein when the second housing moves away from the surface of the first housing, the magnetic force between the second magnetic member and the first magnetic member is decreased, and thus the first elastic member makes the first magnetic member move away from the surface of the first housing.

5. The device according to claim 1, wherein the second elastic member is a spiral spring or a leaf spring.

6. The device according to claim 1, wherein the first elastic member is a spiral spring or a leaf spring.

7. An electronic device comprising:

a first main body having:

a first housing;

a first magnetic member; and a first elastic member connecting with the first magnetic member and the first housing to make the first magnetic member floatable completely within the first housing; and a second main body magnetic-detachably connected with the first main body and having:

a second housing;

a second magnetic member; and a second elastic member disposed within the second housing, wherein the second elastic member connects with the second magnetic member and the second housing, so that the second magnetic member is floatable completely within the second housing;

wherein when a base surface of the second housing moves close to a surface of the first housing, the second magnetic member and the first magnetic member attract each other so that the first and second magnetic members vertically move toward the surface, and thus the magnetic force between the first magnetic member and the second magnetic member is increased and the magnetic forces on an external surface of the second housing and on an external surface of the first housing are decreased.

8. The device according to claim 7, wherein the first magnetic member is a magnet.

9. The device according to claim 7, wherein the second magnetic member is a magnet or is made of a magnetic material.

10. The device according to claim 7, wherein when the base surface of the second housing moves away from the surface of the first housing, the magnetic force between the first magnetic member and the second magnetic member is decreased, and thus the first elastic member makes the first magnetic member move away from the surface of the first housing.

11. The device according to claim 7, wherein the second elastic member is a spiral spring or a leaf spring.

12. The device according to claim 7, wherein the first elastic member is a spiral spring or a leaf spring.

13. The device according to claim 7, wherein the first main body is an input device.

14. The device according to claim 13, wherein the first main body is an external keyboard.

15. The device according to claim 7, wherein the second main body comprises a display device.

\* \* \* \* \*